(12) United States Patent
Ford et al.

(10) Patent No.: US 6,178,033 B1
(45) Date of Patent: Jan. 23, 2001

(54) MICROMECHANICAL MEMBRANE TILT-MIRROR SWITCH

(75) Inventors: Joseph E. Ford; James A. Walker, both of Monmouth, NJ (US)

(73) Assignee: Lucent Technologies, Murray Hill, NJ (US)

( * ) Notice: Under 35 U.S.C. 154(b), the term of this patent shall be extended for 0 days.

(21) Appl. No.: 09/271,577

(22) Filed: Mar. 28, 1999

(51) Int. Cl.⁷ ....................................................... G02F 1/03
(52) U.S. Cl. ........................ 359/247; 359/254; 359/290; 359/291
(58) Field of Search ..................................... 359/290, 291, 359/295, 298, 246, 251, 254, 247

(56) References Cited

U.S. PATENT DOCUMENTS

| | | | |
|---|---|---|---|
| 5,579,151 | * 11/1996 | Cho | 359/291 |
| 5,917,647 | * 6/1999 | Yoon | 359/298 |
| 5,978,128 | * 11/1999 | Yoon | 359/298 |

* cited by examiner

*Primary Examiner*—Huy Mai

(57) ABSTRACT

A micromechanical tilt mirror device that includes a membrane suspended by its ends over a substrate such that a mirror area of the membrane is asymmetrically positioned on the membrane whereby it is tilted when the membrane is deformed by electrostatic forces. This mirror tilt is used to steer an incident light beam in a prescribed direction. The mirror can be supported to provide tilt in either of two orthogonal directions with respect to a rest direction.

14 Claims, 4 Drawing Sheets

MICROMECHANICAL MEMBRANE TILT-MIRROR SWITCH

FIELD OF THE INVENTION

This invention relates to a tilt-mirror switch for use in steering an optical beam and more particularly to such a switch that uses as the mirror a coating on a thin membrane that is suspended and is subject to deflection by electrostatic forces.

BACKGROUND OF THE INVENTION

Tilt-mirror switch arrays are becoming of increasing interest in systems that use optical beams either for transmission of information or for its control.

The most common form of tilt-mirror in such arrays includes a substrate of which the top surface is mirrored to be highly reflective and the back surface is conductive to serve as an electrostatic plate. The substrate is suspended so that its center is supported on a fulcrum about which the substrate can pivot. Pairs of electrodes positioned on opposite sides of the fulcrum are used to create electrostatic forces that pivot the mirror between two stable positions, such that an incident beam can be reflected into a selected one of two different directions, depending on the voltage applied. By applying a control voltage to a selected pair of electrodes to have it attract by electrostatic forces the associated half of the substrate, the mirror can be tilted between the two reflective states. A major problem with such mirrors is the tendency of the mirrors, which are minute is size, to curl, which affects both the direction in which the incident beam is reflected and the optical quality of the reflected beam.

Another form of micromirror for use as a variable reflector in mirror arrays that is of current interest is one that involves a change in attenuation of an incident optical beam rather than a change in the direction of its reflection. Such a mirror is typically formed as a quarter-wave dielectric layer of a material, such as silicon nitride, and supported to act normally as a reflective mirror. Such a mirror is symmetrically suspended over a conductive substrate, typically of doped silicon, by a fixed ¾ wavelength dielectric spacer, typically of a phosphosilicate glass (PSG). An electrode partially covers the membrane, leaving uncovered but surrounding a coated central portion that serves as the mirror. A voltage applied between the electrode and the underlying substrate creates an electrostatic force that, until eliminated, attracts the membrane symmetrically closer to the substrate. The membrane tension provides a linear restoring force when the electrostatic force is eliminated. When the membrane gap is reduced to about a half wavelength by the electrostatic force, the layer becomes an essentially antireflective coating with close to zero reflectivity. The typically 0.4 micrometer vertical deflection of the central portion is small compared to the typically 200–500 micrometer wide membrane. Mechanically, the device moves by elastic deformation, similar to a tuning fork. Electrically, the device behaves as a tiny capacitor with essentially zero-static power dissipation regardless of the reflectivity state.

A more detailed description of such a device is found in our prior paper entitled, "Dynamic Spectral Power Equalization Using Micro-Optic Mechanics," *IEEE Photonics Technology Letters,* Vol. 10, No. 10, October 1998, pps. 1040–1042. In this device, the mirror coating to define the mirror area is centrally located on the membrane, and largely surrounded by an electrode so that the electrostatic force acting is relatively uniform over the surface of the membrane. The change in spacing between the mirror coating and the substrate is relatively uniform over the entire area of the mirror coating so that there is little tilt in the mirror area. In this prior paper, we describe a wavelength division multiplexer equalizer that utilizes such a device. Such an equalizer depends primarily on control of the attenuation of the incident light.

There are other mirror applications in which, instead of attenuation, deflecting or steering of the incident light is desired. To that end, it is desirable that the incident light be controllably steered, as by tilting by a prescribed amount, the mirror area on which the light is incident for reflection and possible redirection along a desired path with little attenuation. The present invention is primarily directed at a mirror for use in steering an incident beam.

SUMMARY OF THE INVENTION

In the present invention a membrane including a mirror area is suspended at its two ends over a substrate as in the prior art variable reflector discussed above, but modified for use as a tilt-mirror. To this end the mirror area is positioned asymmetrically on the membrane between the regions of suspension so that it is tilted a prescribed amount as the membrane is attracted and deformed asymmetrically by the electrostatic force between it and the substrate. Additionally, the electrode that overlies the membrane advantageously does not surround the mirror area but is positioned to augment the deformation tilt experienced by the mirror coating as the membrane is attracted. In particular embodiments, the angular tilt of the mirror can be further facilitated for a given electrostatic force, if desired, by appropriate thinning of the membrane at selected regions. Also in particular embodiments, the membrane is selectively braced to reduce the potential for curling of the mirror area during its deformation.

The invention will be better understood from the following more detailed description taken in conjunction with the accompanying drawing.

DETAILED DESCRIPTION

Figure 1A:
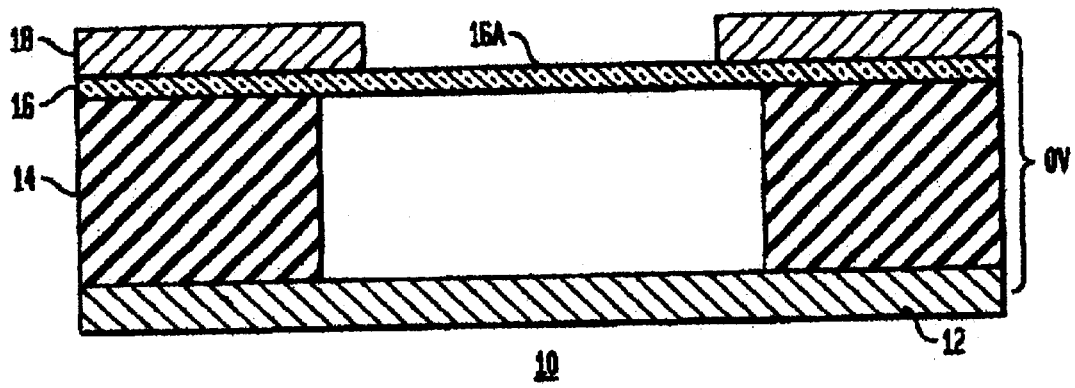
FIGS. 1A and 1B show in cross section the basic form of a single mirror device of the varied reflector prior art form in its two operating states, reflective and non-reflective, respectively.

With reference now to FIG. 1A, the prior art mirror assembly 10 includes a substrate 12, typically of silicon doped to be conductive, dielectric spacers 14, three quarters of a wavelength thick, typically of a phosphosilicate glass (PSG), over which is suspended a thin membrane 16, typically of silicon nitride of a quarter wavelength thickness, that acts as a reflective dielectric mirror in its normal states, with a reflectivity, for example, of about 70 per cent. An electrode 18 largely overlies the membrane 14, leaving exposed only a small central enclosed portion 16A that acts as the mirror area.

Figure 1B:
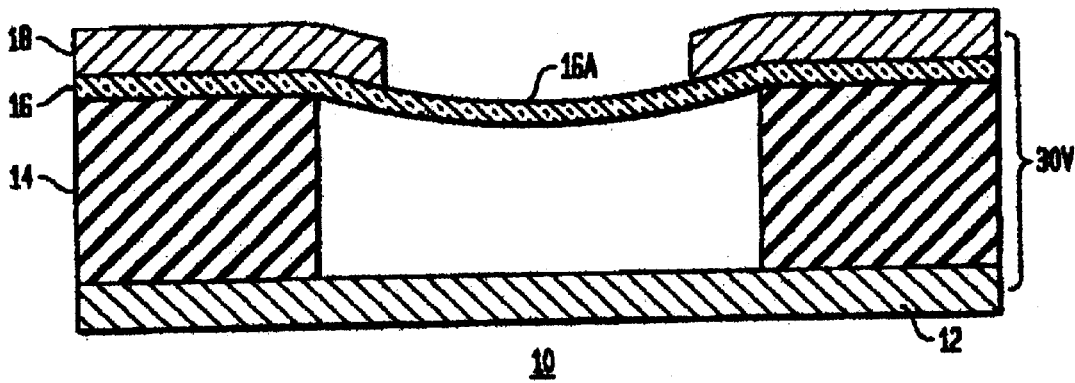

Upon the application of a suitable d-c voltage, such as 30 volts, between the electrode and the substrate, the central membrane area 16A is deformed uniformly by the electrostatic forces created, essentially as shown in FIG. 1B. As discussed, the resulting change in the spacing between the substrate and the central mirror area portion 16A of the membrane transforms the role of the central portion from that of a reflective mirror coating to that of an antireflection coating in which state little incident light is reflected back.

Figure 2A:
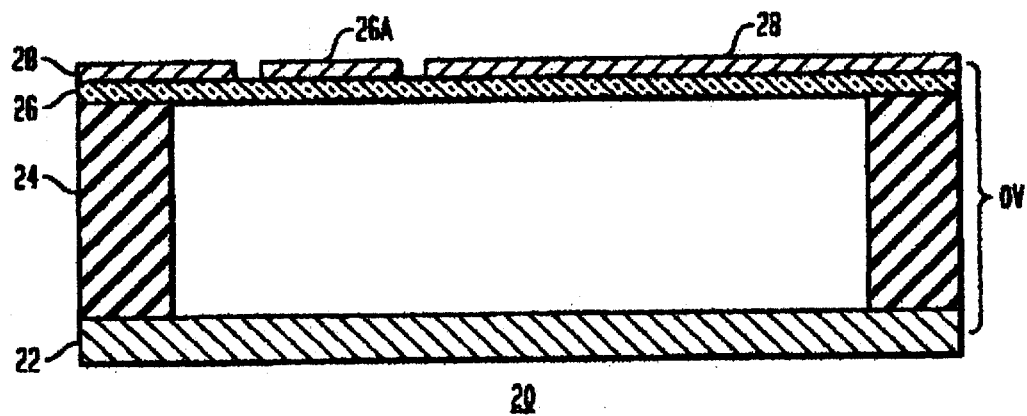
FIG. 2 shows in a similar cross section, the basic form of a single mirror device in accordance with the present invention.
Figure 2B:
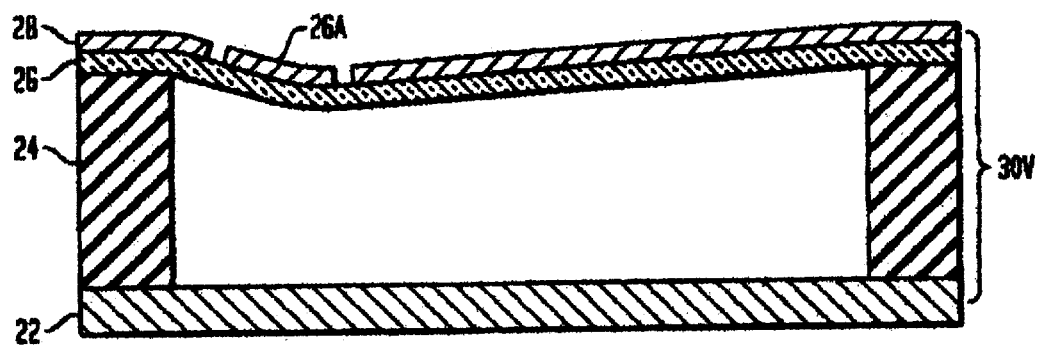

In FIGS. 2A and 2B are shown in the quiescent and deformed states, respectively, cross sections of the basic form of a tilt mirror device 20, in accordance with the present invention, that involves a change in direction of reflection of an incident optical beam. The mirror device comprises a substrate 22, typically of silicon, a dielectric spacer 24, a membrane 26 that includes a coated portion 26A that serves as the mirror, and a top electrode 28 that only partially overlies the membrane 26. In this device, however, the coated region 26A of the membrane is not centrally located, as in the prior art, but is asymmetrically located near the left edge. Moreover, the electrode 28 is located on the membrane 26 only in a region right of the mirror portion 26A. As a result, as seen in FIG. 2B, the mirror 26A, when deformed, is tilted from the horizontal, such that incident light would be reflected at an angle different from the normal in a new direction is as seen in FIG. 2B, and such deflected light can be selectively captured for utilization. In the absence of a deforming force, as in the case of FIG. 2A, the reflected beam is normal to the mirror coating and so it is reflected back along the direction of incidence.

In actual practice, a simple suspended membrane undergoing deflection will tend to have a slight curvature over the deflected length including the mirror rather than the flat surface that would be more desirable for controlled deflection. Also differential thermal expansions of the different materials used can lead to curling with variations in the operating temperature. Several techniques may be employed to keep flatter the mirror portion. In particular a bossed area surrounding the mirror portion of the membrane can help to keep flat the mirror area. Also by thinning the membrane appropriately, the flatness of the mirror area during deformation can be improved. A structure with a balanced material configuration on top and bottom of the membrane can help avoid curling due to temperature changes. Moreover, by isolating the mirror region physically from the rest of the membrane, curling can be minimized.

The foregoing techniques will be described with reference to the remaining figures but it will be helpful first to describe a typical process for forming the basic device. The typical processing involves techniques that are now well established for the preparation of micromechanical devices and largely involve technologies developed originally for use in the manufacture of integrated circuits.

The mirror devices are formed in large arrays typically by first coating a wafer, preferably of doped silicon, or of undoped silicon including a conductive coating over its top surface, with a layer of a dielectric material that can be easily etched, such as a phosphosilicate glass (PSG) of appropriate thickness to provide the spacers, and this PSG layer is covered in turn with a film suitable to serve as the membrane, typically of a material such as silicon nitride, undoped polysilicon or a silicon nitride-polysilicon composite.

This film is then patterned both to form the desired geometry of the mirror devices and to provide access holes in the film that will permit attack of the underlying PSG layer by a wet etch to leave a membrane suspended at its ends between pairs of PSG spacers. Then the mirror and electrode coatings are deposited and appropriately patterned on top of the structural film. Finally the wafer is immersed in the wet etch, typically hydrofluoric acid (HF), which selectively removes the PSG, to allow isotropic undercutting of the mechanically active membrane regions, thereby forming the tilt mirror array. Typically the mirror and electrode coatings are thin layers of gold to provide both the desired physical properties and to be resistant to the HF etch. As a possible modification, the deposition and patterning of the mirrors and electrodes may occur after the sacrificial wet etch, if there is potential incompatibility between the metals to be used for the coatings and the wet etch.

Figure 3:
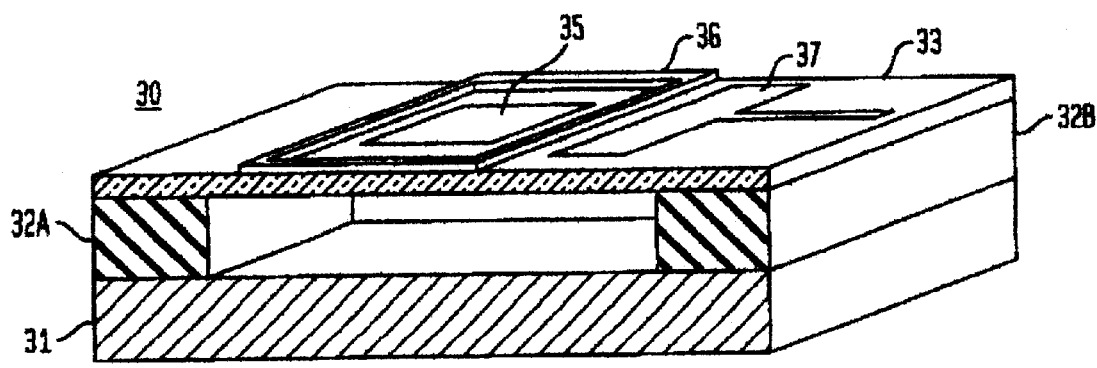
FIGS. 3–5 show other tilt mirror embodiments of the invention.

In FIG. 3, there is shown a single mirror device 30, in accordance with the invention, that utilizes a bossed mirror area. Generally, as discussed earlier, such devices will be assembled in large arrays, either one-dimensional or two-dimensional arrays. The device 30 includes a substrate 31, typically of silicon about 20 mils thick. The silicon advantageously is doped to be conductive to serve as one electrode of the capacitor that is to be formed. Alternatively, it can include a conductive coating over its top surface. Dielectric spacers 32A, 32B at opposite ends of the substrate support the membrane 33 over the substrate. As described earlier, the dielectric supports typically are of PSG, advantageously deposited by low pressure chemical vapor deposition (LPCVD), of appropriate thickness, typically less than 20 microns thick. The membrane may typically be of silicon nitride polysilicon or a silicon nitride-polysilicon composite, of appropriate thickness (0.1–4 microns thick), and generally a fraction of the PSG thickness. The membrane thickness needs to be sufficient to maintain the membrane essentially rigid with little sag between the end spacers in the absence of an applied electrostatic force designed to deflect it. The membrane 33 supports asymmetrically, near one of its edges, a mirror area 35, advantageously defined either by a dielectric multilayer reflector or by a metal coating, as of gold several hundred Angstroms thick, that will be highly reflective of the incident light. Typically the mirror area will be about 20–200 microns on a side. To minimize curling of the mirror 35, it is enclosed within a bossed frame 36, typically provided by a patterned layer of polysilicon between one and three micrometers thick to be of sufficient rigidity to serve the intended stiffening role.

The bossed frame 36 is shown here as overlying the membrane 30; however it could also be positioned to underlie the membrane. The latter position would be advantageous, if chemical mechanical polishing (CMP) were to be used to provide a flat mirror.

The polysilicon frame 36 should surround the mirror-coated area as closely as is feasible with available technology. The membrane 33 also supports a patterned electrode coating 37 of a conductive material, also such as gold up to a few microns thick, to serve as the top plate of a capacitor with the conductive substrate 31 serving as the bottom plate. This electrode 37 advantageously is positioned along the membrane 33 such that, when an appropriate voltage is applied between the two plates of the capacitor, the membrane 33 is deflected by the force concentrated at the electrode, and the mirror area 35 is tilted enough, typically a few degrees from the horizontal is sufficient, such that an incident light beam is steered sufficiently away from the normal direction to be readily distinguished from a beam that is reflected when the membrane 33 is not deflected. If desired, the angular deflection or tilt of the mirror area 35 can be increased, either by having the electrode 37 extend over a larger percentage of the length of the unsupported membrane or by asymmetrically locating the electrode 37 closer to where the mirror area 35 is located. For a 100 micron long, 50 micrometer wide, structural beam formed by the membrane between the two spaced supports, there is readily achievable an angular deflection of about 2 degrees of a 10-micrometer long mirror located 5 micrometers in from the left end with only a 5,000 Angstroms deflection from the quiescent undeflected state.

Figure 4:
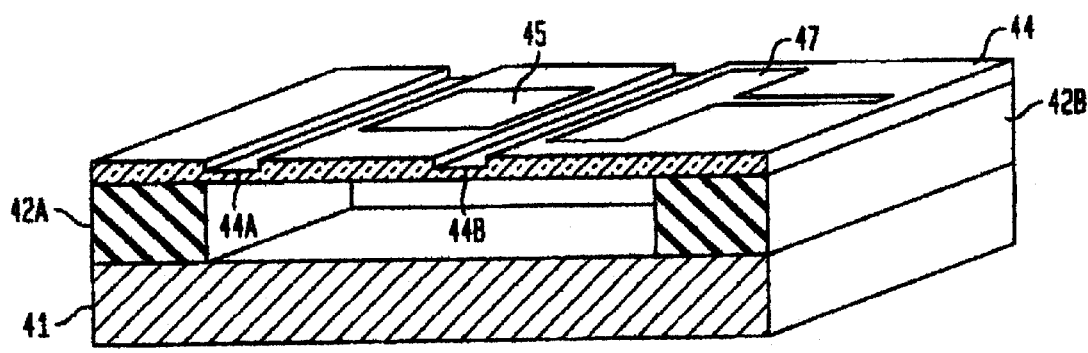

The amount of deflection for a given force can be enhanced, if desired, by the addition of etched regions appropriately located in the membrane to reduce its thickness there. In FIG. 4, there is shown the tilt mirror device 40 that in most respects resembles the tilt mirror device 30 shown in FIG. 3. It includes the substrate 41 and spacers 42A and 42B. It differs only in the elimination of the frame layer 36 of polysilicon and its replacement by notched, or thinned, regions 44A, 44B in membrane 44 on opposite sides of the coated mirror area 45. Typically these notched regions can be about 10 micrometers wide, can extend across the full width of the membrane 44 as shown, and can serve to thin effectively the thickness of the membrane 44 to a fraction, for example, about one half its original thickness. The use of the notches 44A, 44B should help in concentrating the bending action to the mirror region between the notches. An electrode 47 is used to control the bending, as before.

Figure 5:
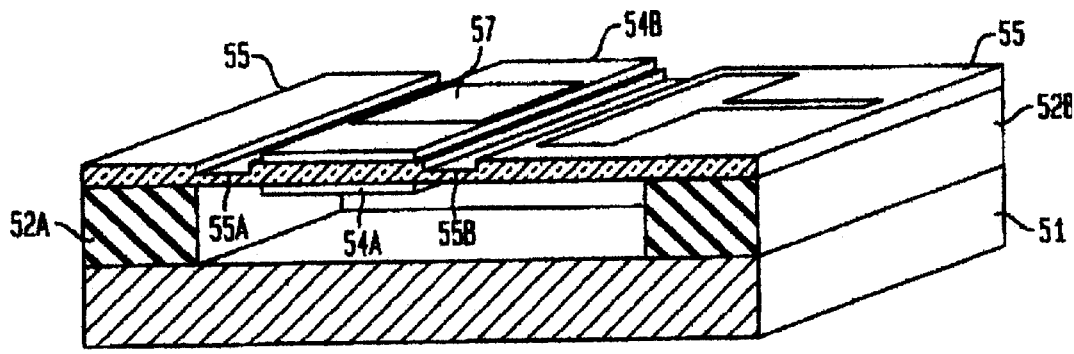

Another technique that can be used to minimize curling of the mirror area is illustrated by the tilt-mirror device 50 shown in FIG. 5. It includes the silicon substrate 51, dielectric supports 52A, 52B, and a membrane 55. In this embodiment, polysilicon layers 54A, 54B are provided on the lower and upper surfaces, respectively, of the membrane 55 between its notched areas 55A and 55B. The mirror coating 57 is provided over a portion of the top layer 54A of the dual polysilicon layers. Again the dual layers and the mirror coating advantageously are asymmetrically located near one end of the beam formed by the suspended membrane 55. As before, an electrode 58 is provided asymmetrically over the membrane to serve as the upper plate of the capacitor formed with the conductive substrate 51.

Figure 6:
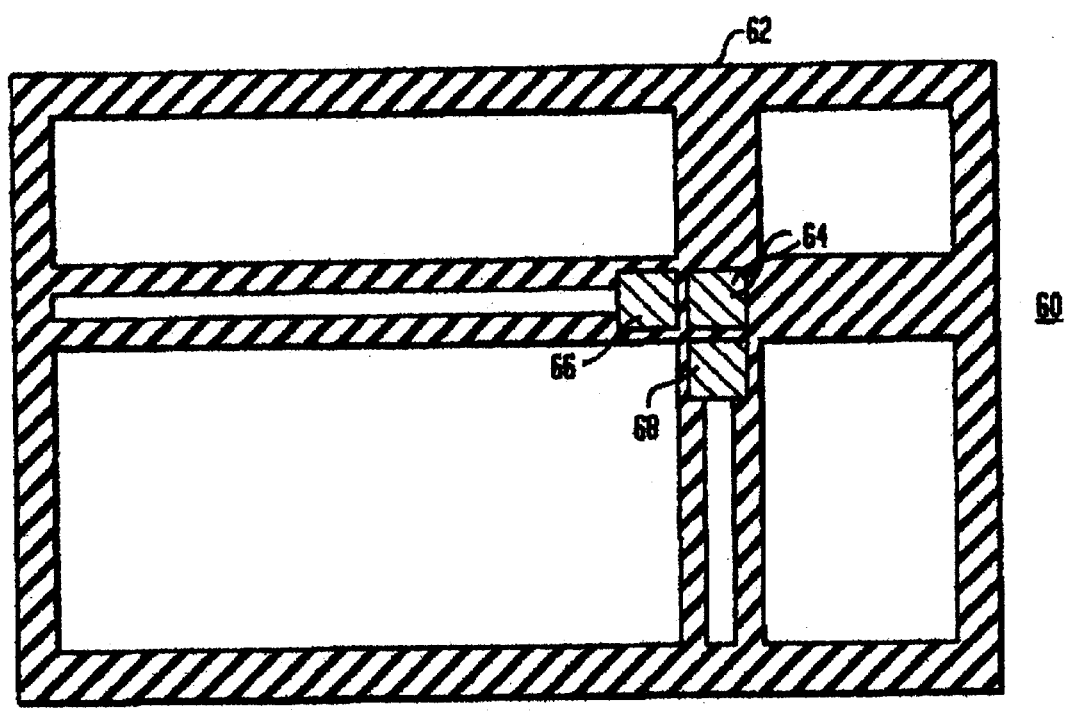
FIG. 6 shows schematically a two-dimensional tilt-mirror arrangement in accordance with the invention.

FIG. 6 shows schematically a top view of a tilt-mirror in which the tilt can be in either of two essentially orthogonal dimensions. In this arrangement, the membrane 62 that supports the mirror 64 is held suspended over the substrate at four edges by two pairs of dielectric supports, disposed orthogonally with respect to one another, and separate electrodes 66, 68 are provided for separate control of each of the two possible orthogonal directions of deflection of the membrane. The mirror curl may be controlled in any of the ways discussed with reference to FIGS. 2–5.

It is to be understood that the specific embodiments described are merely illustrative of the general principles of the invention and that a worker in the art could devise alternative embodiments without departing from the spirit and scope of the invention. In particular, tilt-mirror arrays of the kind described can find use in a wide variety of apparatus for use with optical signals, including Add/Drop apparatus for use in WDM optical systems.

What is claimed:

1. A micromechanical tilt mirror device comprising:
   a conductive substrate;
   an insulative membrane including a mirror area;
   insulative spacers supporting the membrane over the conductive substrate normally in essentially a parallel relationship;
   an electrode on the conductive substrate for use with the conductive substrate in establishing an electrostatic force in response to an applied voltage for deforming the membrane and tilting the mirror area of the membrane is assymetrically positioned between the ends of the membrane whereby the deformation of the mirror tilts the mirror area such that a light beam incident on the tilted mirror area is reflected in a predetermined direction;
   and means surrounding the mirror area for stiffening the flatness of the mirror area when tilted and reducing any curling of the mirror area.

2. A micromechanical tilt-mirror device in accordance with claim 1 in which the stiffening means is positioned on the top surface of the membrane.

3. A micromechanical tilt-mirror device in accordance with claim 2 in which the stiffening means is positioned on the bottom surface of the membrane.

4. A micromechanical tilt mirror device in accordance with claim 1 in which the mirror area is located in the membrane between notched regions of thinned membrane thickness.

5. A micromechanical tilt-mirror device in accordance with claim 1 in which stiffening means are provided on both the top and bottom membrane surfaces.

6. A micromechanical tilt mirror device in accordance with claim 1 in which the mirror area is defined by a reflective coating on the membrane.

7. A electromechanical tilt-mirror device in accordance with claim 6 including means for providing stiffening to the mirror area to reduce curling of the mirror area.

8. A micromechanical tilt-mirror in accordance with claim 1 in which the membrane thickness is between about 0.1 and 4.0 microns.

9. A micromechanical tilt-mirror in accordance with claim 8 in which the membrane is supported above the substrate a distance of between about 0.3 and 20 microns.

10. An array of electromechanical tilt-mirrors on a common substrate, each in accordance with the electromechanical tilt-mirror of claim 1.

11. A electromechanical tilt-mirror device that can be tilted in either of two orthogonal directions comprising:
    a conductive substrate,
    a membrane including a mirror area asymmetrically disposed in two orthogonal directions along the membrane,
    two pairs of dielectric spacers disposed orthogonally for supporting the membrane along four edges defining the two orthogonal directions,
    and means for deforming the membrane and tilting the mirror selectively in either of the two directions.

12. An electromechanical tilt-mirror device that can be tilted in either of two essentially orthogonal directions, comprising
    a conductive substrate,
    a membrane including a mirror area,
    two pairs of dielectric spacers orthogonally disposed for supporting the membrane,
    separate pairs of electrodes for each of the two tilt directions, wherein the mirror area of the membrane is asymmetrically positioned on the membrane to provide two orthogonally different tilt directions.

13. A electromechanical tilt-mirror in accordance with claim 12 in which the membrane includes means for maintaining the flatness of the mirror area.

14. An array of electromechanical tilt-mirrors on a common substrate each in accordance with the electromechanical tilt-mirror of claim 12.

* * * * *